United States Patent
Ono et al.

(10) Patent No.: US 12,037,283 B2
(45) Date of Patent: *Jul. 16, 2024

(54) GLASS SUBSTRATE FOR HIGH-FREQUENCY DEVICE AND CIRCUIT BOARD FOR HIGH-FREQUENCY DEVICE

(71) Applicant: AGC Inc., Tokyo (JP)

(72) Inventors: Kazutaka Ono, Tokyo (JP); Shuhei Nomura, Tokyo (JP); Nobutaka Kidera, Tokyo (JP); Nobuhiko Takeshita, Tokyo (JP)

(73) Assignee: AGC Inc., Tokyo (JP)

( * ) Notice: Subject to any disclaimer, the term of this patent is extended or adjusted under 35 U.S.C. 154(b) by 606 days.

This patent is subject to a terminal disclaimer.

(21) Appl. No.: 17/174,615

(22) Filed: Feb. 12, 2021

(65) Prior Publication Data

US 2021/0163341 A1 Jun. 3, 2021

Related U.S. Application Data

(63) Continuation of application No. 16/351,007, filed on Mar. 12, 2019, now Pat. No. 10,974,987, which is a continuation of application No. PCT/JP2017/031240, filed on Aug. 30, 2017.

(30) Foreign Application Priority Data

Sep. 13, 2016  (JP) ................................ 2016-178512
Mar. 17, 2017  (JP) ................................ 2017-053300

(51) Int. Cl.
| | |
|---|---|
| C03C 3/089 | (2006.01) |
| C03C 3/091 | (2006.01) |
| C03C 4/16 | (2006.01) |
| H05K 1/02 | (2006.01) |
| H05K 1/03 | (2006.01) |
| C03B 17/02 | (2006.01) |
| C03B 17/06 | (2006.01) |
| C03B 19/14 | (2006.01) |
| C03B 25/08 | (2006.01) |
| C03C 3/06 | (2006.01) |
| C03C 3/087 | (2006.01) |
| C03C 3/118 | (2006.01) |
| C03C 13/04 | (2006.01) |

(52) U.S. Cl.
CPC .............. *C03C 3/089* (2013.01); *C03C 3/091* (2013.01); *C03C 4/16* (2013.01); *H05K 1/024* (2013.01); *H05K 1/03* (2013.01); *C03B 17/02* (2013.01); *C03B 17/064* (2013.01); *C03B 19/14* (2013.01); *C03B 25/08* (2013.01); *C03C 3/06* (2013.01); *C03C 3/087* (2013.01); *C03C 3/118* (2013.01); *C03C 13/046* (2013.01); *C03C 2204/08* (2013.01); *C03C 2217/253* (2013.01)

(58) Field of Classification Search
CPC .......... C03C 3/089; C03C 3/085; C03C 3/091
See application file for complete search history.

(56) References Cited

U.S. PATENT DOCUMENTS

| | | | |
|---|---|---|---|
| 4,946,546 A | 8/1990 | Bourgeois-Moine | |
| 5,824,127 A | 10/1998 | Bange et al. | |
| 6,128,924 A | 10/2000 | Bange et al. | |
| 10,974,987 B2* | 4/2021 | Ono | C03C 3/091 |
| 11,239,549 B2* | 2/2022 | Nomura | C03C 3/087 |
| 11,594,811 B2* | 2/2023 | Nomura | H01Q 1/364 |
| 11,708,294 B2* | 7/2023 | Ono | C03C 3/089 |
| | | | 501/59 |
| 2003/0193286 A1 | 10/2003 | Ottermann et al. | |
| 2004/0043887 A1 | 3/2004 | Paulson | |
| 2004/0182602 A1 | 9/2004 | Satoh et al. | |
| 2005/0175846 A1 | 8/2005 | Mund et al. | |
| 2005/0227408 A1 | 10/2005 | Leib et al. | |
| 2005/0233503 A1 | 10/2005 | Leib et al. | |
| 2006/0012005 A1 | 1/2006 | Leib et al. | |
| 2006/0030074 A1 | 2/2006 | Mund. et al. | |
| 2006/0051584 A1 | 3/2006 | Bieck et al. | |
| 2006/0177963 A1 | 8/2006 | Mund et al. | |
| 2006/0293162 A1 | 12/2006 | Ellison | |

(Continued)

FOREIGN PATENT DOCUMENTS

| | | |
|---|---|---|
| CN | 103249689 A | 8/2013 |
| CN | 103547538 A | 1/2014 |

(Continued)

OTHER PUBLICATIONS

Murata, T., et al., "Ultra thin glass roll for flexible AMOLED display", 18th, International Display Workshop 2011, Nagoya, Japan. Dec. 7-9, 2011, vol. 1 of 3, pp. 1735-1737 with cover pages (31 total pages).

(Continued)

*Primary Examiner* — Elizabeth A. Bolden (74) *Attorney, Agent, or Firm* — Oblon, McClelland, Maier & Neustadt, L.L.P.

(57) ABSTRACT

A glass substrate for a high-frequency device, which contains, in terms of mole percent on the basis of oxides: 40 to 75% of $SiO_2$; 0 to 15% of $Al_2O_3$; 13 to 23% of $B_2O_3$; 2.5 to 11% of MgO; and 0 to 13% of CaO, and having a total content of alkali metal oxides in the range of 0.001-5%, where at least one main surface of the glass substrate has a surface roughness of 1.5 nm or less in terms of arithmetic average roughness Ra, and the glass substrate has a dielectric dissipation factor at 35 GHz of 0.007 or less.

15 Claims, 1 Drawing Sheet

(56) References Cited

U.S. PATENT DOCUMENTS

| | | |
|---|---|---|
| 2007/0166520 A1 | 7/2007 | Leib et al. |
| 2008/0030130 A1 | 2/2008 | Ottermann et al. |
| 2008/0103036 A1 | 5/2008 | Boessneck et al. |
| 2008/0127679 A1 | 6/2008 | Nishizawa et al. |
| 2011/0042129 A1 | 2/2011 | Boessneck et al. |
| 2011/0079049 A1 | 4/2011 | Ellison |
| 2011/0082022 A1 | 4/2011 | Ellison |
| 2012/0135852 A1 | 5/2012 | Ellison et al. |
| 2012/0302063 A1 | 11/2012 | Markham et al. |
| 2013/0065748 A1 | 3/2013 | Koyama et al. |
| 2014/0075995 A1 | 3/2014 | Ando et al. |
| 2014/0152914 A1 | 6/2014 | King |
| 2014/0309098 A1 | 10/2014 | Koyama et al. |
| 2015/0051060 A1 | 2/2015 | Ellison et al. |
| 2015/0203397 A1 | 7/2015 | Mikami et al. |
| 2015/0218041 A1 | 8/2015 | Mikami et al. |
| 2015/0368146 A1 | 12/2015 | Ellison et al. |
| 2016/0251257 A1 | 9/2016 | Mikami et al. |
| 2020/0123043 A1* | 4/2020 | Ono .................. H05K 1/03 |
| 2021/0163341 A1 | 6/2021 | Ono et al. |
| 2021/0261456 A1 | 8/2021 | Ono et al. |
| 2023/0163453 A1* | 5/2023 | Nomura .................. C03C 3/091 |
| | | 343/702 |

FOREIGN PATENT DOCUMENTS

| | | |
|---|---|---|
| EP | 1 653 499 A1 | 5/2006 |
| EP | 1 961 710 A1 | 8/2008 |
| JP | 64-051345 | 2/1989 |
| JP | 1-212754 | 8/1989 |
| JP | 09-002839 | 1/1997 |
| JP | 2001-500098 A | 1/2001 |
| JP | 2003-137590 A | 5/2003 |
| JP | 2003137590 A * | 5/2003 ............ C03C 13/00 |
| JP | 2004-168597 A | 6/2004 |
| JP | 2004-244271 | 9/2004 |
| JP | 2004-269269 A | 9/2004 |
| JP | 2004-282412 A | 10/2004 |
| JP | 2005-93422 A | 4/2005 |
| JP | 2005-537209 A | 12/2005 |
| JP | 2006-36625 A | 2/2006 |
| JP | 2006-36826 A | 2/2006 |
| JP | 2006/513558 A | 4/2006 |
| JP | 2007-39324 A | 2/2007 |
| JP | 2007-182366 A | 7/2007 |
| JP | 2008-544942 A | 12/2008 |
| JP | 2010-30848 | 2/2010 |
| JP | 2010-508226 | 3/2010 |
| JP | 2011-42509 A | 3/2011 |
| JP | 2013-77769 | 4/2013 |
| JP | 2014-224025 A | 12/2014 |
| JP | 2015-20914 A | 2/2015 |
| JP | 2015-160326 A | 9/2015 |
| JP | 2016-5999 A | 1/2016 |
| JP | 2016-94339 A | 5/2016 |
| JP | 2017-204527 | 11/2017 |
| TW | 201428581 A | 7/2014 |
| WO | WO 2015/023525 A1 | 2/2015 |
| WO | WO 2018/053078 A1 | 3/2018 |

OTHER PUBLICATIONS

Navias, L., et al., "Dielectric Properties of Glasses at Ultra-High Frequencies and Their Relation to Composition", The Journal of the American Ceramic Society, Oct. 1, 1946, vol. 29, No. 10, pp. 267-276.

International Search Report issued Nov. 28, 2017 in PCT/JP2017/031240 filed Aug. 30, 2017 (with English Translation).

Written Opinion issued Nov. 28, 2017 in PCT/JP2017/031240 filed Aug. 30, 2017.

Day, D. E., "Mixed Alkali Glasses—Their Properties and Uses", Journal of Non-Crystalline Solids, 1976, pp. 343-372.

Huang Wanjing, "Principle and Application of Marine Ozone Generator" Dec. 31, 2008, Paragraph 2, p. 101 of the text (with partial English translation).

* cited by examiner

GLASS SUBSTRATE FOR HIGH-FREQUENCY DEVICE AND CIRCUIT BOARD FOR HIGH-FREQUENCY DEVICE

CROSS REFERENCE TO RELATED APPLICATIONS

This application is a continuation of U.S. application Ser. No. 16/351,007, filed on Mar. 12, 2019, which is a continuation of international patent application PCT/JP2017/031240, filed on Aug. 30, 2017, the text of which is incorporated by reference, and claims foreign priority to Japanese Patent Application No. 2017-053300, filed on Mar. 17, 2017, and Japanese Patent Application No. 2016-178512, filed on Sep. 13, 2016, the entire contents of which is incorporated herein by reference.

TECHNICAL FIELD

The present invention relates to a glass substrate for a high-frequency device and a circuit board for a high-frequency device.

BACKGROUND ART

In the field of electronic devices such as communication appliances such as cell phones, smartphones, personal digital assistants and Wi-Fi appliances, surface acoustic wave (SAW) devices, radar components, and antenna components, use of higher signal frequencies is being advanced in order to increase the communication capacity, heighten the communication speed, etc. Circuit boards for use in electronic appliances for such high-frequency applications generally employ insulating substrates such as resin substrates, ceramic substrates, and glass substrates. The insulating substrates for use in high-frequency devices are required to reduce transmission losses based on dielectric loss, conductor loss, etc, in order to ensure the quality, intensity, and other properties of high-frequency signals.

Among such insulating substrates, resin substrates have low rigidity due to the nature thereof. Because of this, it is difficult to apply resin substrates in the case where rigidity (strength) is required for the semiconductor package products. Ceramic substrates have a drawback in that it is difficult to heighten the surface smoothness thereof and this is prone to result in an increased conductor loss due to the conductor formed on the substrate surface. Meanwhile, glass substrates are characterized by having high rigidity to make size and thickness reductions, etc. of packages easy, and by having excellent surface smoothness and being easily produced as larger-size substrates.

BACKGROUND ART DOCUMENT

Patent Document

Patent Document 1: JP-A-2013-077769
Patent Document 2: JP-A-2004-244271

SUMMARY OF THE INVENTION

Problems that the Invention is to Solve

However, conventional alkali-free glass substrates, although effective in reducing dielectric loss and transmission loss based thereon at frequencies up to about 20 GHz, have limitations in reducing the dielectric loss in a high-frequency range beyond, for example, 30 GHz. It is hence difficult for circuit boards employing conventional alkali-free glass substrates to maintain the quality, intensity, and other properties of high-frequency signals having a frequency exceeding 30 GHz. Meanwhile, quartz glass substrates can retain a low dielectric loss even in the range of frequencies exceeding 30 GHz. However, the quartz glass substrates have a drawback in that the thermal expansion coefficient thereof is so low that there is too large a difference in thermal expansion coefficient between the quartz glass substrate and other members in configuring an electronic device. This is a factor which lowers the suitability for practical use of the electronic device.

An object of the present invention is to provide: a glass substrate for a high-frequency device, the glass substrate being capable of reducing the dielectric loss of high-frequency signals and of providing practical electronic devices; and a circuit board for a high-frequency device, the circuit board employing the glass substrate and being capable of reducing the transmission loss of high-frequency signals.

Means for Solving the Problems

A glass substrate for a high-frequency device according to a first embodiment of the present invention is a glass substrate for a high-frequency device, which includes $SiO_2$ as a main component, the glass substrate having a total content of alkali metal oxides in the range of 0.001-5% in terms of mole percent on the basis of oxides, the alkali metal oxides having a molar ratio represented by $Na_2O/(Na_2O+K_2O)$ in the range of 0.01-0.99, and the glass substrate having a total content of $Al_2O_3$ and $B_2O_3$ in the range of 1-40% in terms of mole percent on the basis of oxides and having a molar ratio represented by $Al_2O_3/(Al_2O_3+B_2O_3)$ in the range of 0-0.45, in which at least one main surface of the glass substrate has a surface roughness of 1.5 m or less in terms of arithmetic average roughness Ra, and the glass substrate has a dielectric dissipation factor at 35 GHz of 0.007 or less.

A glass substrate for a high-frequency device according to a second embodiment of the present invention is a glass substrate for a high-frequency device, which includes $SiO_2$ as a main component, the glass substrate having a total content of alkali metal oxides in the range of 0.001-5% in terms of mole percent on the basis of oxides, the alkali metal oxides having a molar ratio represented by $Na_2O(Na_2O+K_2O)$ in the range of 0.01-0.99, and the glass substrate having a total content of alkaline earth metal oxides in the range of 0.1-13% in terms of mole percent on the basis of oxides, in which at least one main surface of the glass substrate has a surface roughness of 1.5 nm or less in terms of arithmetic average roughness Ra, and the glass substrate has a dielectric dissipation factor at 35 GHz of 0.007 or less.

A circuit board for a high-frequency device according to a third embodiment of the present invention is a circuit board for a high-frequency device, including: the glass substrate according to the first embodiment or the second embodiment of the present invention; and a wiring layer formed on the main surface of the glass substrate, in which the circuit board has a transmission loss at 35 GHz of 1 dB/cm or less.

Advantage of the Invention

According to the glass substrate for a high-frequency device of the present invention, it is possible to reduce the dielectric loss of high-frequency signals. According to the circuit board employing this glass substrate, the transmission loss of high-frequency signals can be reduced and it is possible to provide a practical high-frequency device, e.g., electronic device.

MODE FOR CARRYING OUT THE INVENTION

Embodiments of the present invention are explained. Each numerical range given with "-" includes the numerical values that precede and succeed the "-", as the lower limit and the upper limit, respectively. The content of each component in a glass substrate is given in terms of mole percent (mol %) on the basis of oxides unless otherwise indicated. In this description, the term "high-frequency" means frequencies of 10 GHz or higher, preferably higher than 30 GHz, more preferably 35 GHz or higher.

Figure 1:
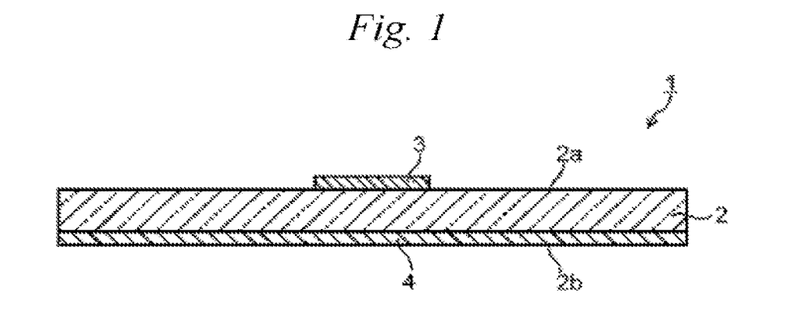
FIG. 1 is a cross-sectional view illustrating the configuration of a circuit board according to an embodiment.

FIG. 1 illustrates a circuit board for a high-frequency device according to an embodiment of the present invention. The circuit board 1 illustrated in FIG. 1 includes a glass substrate 2 having insulating properties, a first wiring layer 3 formed on a first main surface 2a of the glass substrate 2, and a second wiring layer 4 formed on a second main surface 2b of the glass substrate 2. The first and second wiring layers 3 and 4 form microstrip lines as an example of transmission lines. The first wiring layer 3 constitutes signal wiring and the second wiring layer 4 constitutes ground wiring. However, the structures of the first and second wiring layers 3 and 4 are not limited to these, and the wiring layers may have been formed only on one main surface of the glass substrate 2.

The first and second wiring layers 3 and 4 are layers formed by a conductor and have a thickness of usually about 0.1 μm to 50 μm. The conductor which constitutes the first and second wiring layers 3 and 4 is not particularly limited, and use is made, for example, of metals such as copper, gold, silver, aluminum, titanium, chromium, molybdenum, tungsten, platinum, and nickel, alloys or metal compounds containing at least one of these metals, etc. The structures of the first and second wiring layers 3 and 4 are not limited to a single-layer structure, and the wiring layers 3 and 4 may have a structure including a plurality of layers, such as a multilayer structure including a titanium layer and a copper layer. Methods for forming the first and second wiring layers 3 and 4 are not particularly limited. For example, various known formation methods can be applied, such as a printing method in which a conductor paste is used, dipping, plating, vapor deposition, and sputtering.

The glass substrate 2 includes a glass substrate for a high-frequency device according to an embodiment of the present invention and has the property of having a dielectric dissipation factor (tan δ) at 35 GHz of 0.007 or less. The glass substrate 2 preferably has a relative permittivity at 35 GHz of 10 or less. Since the glass substrate 2 has a dielectric dissipation factor at 35 GHz of 0.007 or less, this glass substrate 2 can be reduced in dielectric loss in the range of frequencies exceeding 30 GHz. Also by regulating the relative permittivity at 35 GHz of the glass substrate 2 to 10 or less, the dielectric loss in a high-frequency range can be reduced. The dielectric dissipation factor at 35 GHz of the glass substrate 2 is more preferably 0.005 or less, even more preferably 0.003 or less. The relative permittivity of the glass substrate 2 is more preferably 7 or less, even more preferably 6 or less, especially preferably 5 or less.

The main surfaces 2a and 2b of the glass substrate 2, on which the first and second wiring layers 3 and 4 are to be formed, have a surface roughness of 1.5 nm or less in terms of arithmetic average roughness Ra. Since the main surfaces 2a and 2b of the glass substrate 2, on which the first and second wiring layers 3 and 4 are to be formed, have an arithmetic average roughness Ra of 1.5 nm or less, the first and second wiring layers 3 and 4 can be reduced in skin resistance even when a skin effect has occurred in the first and second wiring layers 3 and 4 in a high-frequency range beyond GHz, thereby attaining a reduction in conductor loss. The arithmetic average roughness Ra of the main surfaces 2a and 2b of the glass substrate 2 is more preferably 1.0 nm or less, even more preferably 0.5 nm or less. The term "main surface of the glass substrate 2" means a surface on which a wiring layer is to be formed. In the case where the wiring layers are formed on one main surface, it is only required that the one main surface should have an arithmetic average roughness Ra of 1.5 m or less. The term "surface roughness Ra" in this description means a value obtained in accordance with JIS B0601 (year 2001).

The surface roughness of the main surfaces 2a and 2b of the glass substrate 2 can be attained by subjecting the surfaces of the glass substrate 2 to a polishing treatment or the like according to need. The surfaces of the glass substrate 2 can be polished, for example, by: mechanical polishing with an abrasive including cerium oxide, colloidal silica, or the like as a main component and with a polishing pad, chemical-mechanical polishing in which a polishing slurry, which includes an abrasive and an acidic or alkaline liquid as a dispersion medium, and a polishing pad are used; or chemical polishing in which an acidic liquid or an alkaline liquid is used as an etchant. These polishing treatments are used in accordance with the surface roughness of the glass plate to be used as a material for the glass substrate 2. For example, preliminary polishing and finish polishing may be conducted in combination. It is preferable that the edge surfaces of the glass substrate 2 have been chamfered in order to prevent the glass substrate 2, when being processed, from suffering breakage, cracking, or chipping which occurs from an edge surface. The chamfering may be any of C-chamfering, R-chamfering, light-chamfering, etc.

Due to the use of the glass substrate 2 having such properties, the circuit board 1 can have a reduced transmission loss at 35 GHz, specifically, 1 dB/cm or less. Consequently, the quality, intensity, and other properties of high-frequency signals, in particular, high-frequency signals having a frequency exceeding 30 GHz and even high-frequency signals of 35 GHz or higher, are maintained Thus, a glass substrate 2 and a circuit board 1 that are suitable for high-frequency devices in which such high-frequency signals are processed can be provided. Namely, the characteristics and quality of high-frequency devices in which such high-frequency signals are processed can be improved. The transmission loss at 35 GHz of the circuit board 1 is more preferably 0.5 dB/cm or less.

A glass substrate 2 having the above-described dielectric properties including dielectric dissipation factor can be attained by forming a glass substrate including $SiO_2$ as a main component and as a network-forming substance so that the glass substrate satisfies requirements (1) and (2), or requirements (1) and (3), or requirements (1), (2), and (3), which are shown below. The glass substrate 2 is formed by melting and hardening a raw-material composition.

Although methods for producing the glass substrate 2 are not particularly limited, use can be made, for example, of a method in which a general-purpose molten glass is formed into a sheet having a given thickness by the float process and the sheet is annealed and then cut into a desired shape to obtain a plate glass.

The term "glass" in this description means a solid which is amorphous, as defined, and shows glass transition. The term does not mean a crystallized glass, which is a mixture of a glass and crystals, or a sintered glass which contains a crystalline filler. That a glass is entirely amorphous can be ascertained by examining the glass by X-ray diffractometry and ascertaining the absence of any distinctive diffraction peak.

In this description, the expression "including $SiO_2$ as a main component" means that the content of $SiO_2$, in component proportion in terms of mole percent on the basis of oxides, is the highest.

Requirement (1): the glass substrate 2 has a total content of alkali metal oxides in the range of 0.001-5%, the alkali metal oxides having a molar ratio represented by $Na_2O$ ($Na_2+K_2O$) in the range of 0.01-0.99.

Requirement (2): the glass substrate (2) has a total content of $Al_2O_3$ and $B_2O_3$ in the range of 1-40% and has a molar ratio represented by $Al_2O_3/(Al_2O_3+B_2O_3)$ in the range of 0-0.45.

Requirement (3): the glass substrate 2 has a total content of alkaline earth metal oxides in the range of 0.1-13%.

With respect to requirement (1), the low-dielectric-loss characteristics of the glass substrate 2, which includes $SiO_2$ as a main component, can be enhanced by regulating the content of alkali metal oxides in the glass substrate 2 to 5% or less. Meanwhile, by regulating the content of alkali metal oxides therein to 0.001% or higher, not only practical glass meltability and practical efficiency of producing the glass substrate 2 are obtained without necessitating excess purification of raw materials but also the thermal expansion coefficient of the glass substrate 2 can be regulated. Examples of the alkali metal oxides which can be contained in the glass substrate 2 include $Li_2O$, $Na_2O$, $K_2O$, $Rb_2O$, and $Cs_2O$, but $Na_2O$ and $K_2O$ are especially important. It is hence preferable that the total content of $Na_2O$ and $K_2O$ is in the range of 0.001-5%. The content of alkali metal oxides is desirably 3% or less, preferably 1% or less, even more preferably 0.2% or less, in particular 0.1% or less, especially preferably 0.05% or less. The content of alkali metal oxides is more preferably 0.002% or higher, even more preferably 0.003% or higher, especially preferably 0.005% or higher.

Furthermore, by causing $Na_2O$ and $K_2O$ to coexist in a vitreous substance including $SiO_2$ as a main component, in other words, by regulating the molar ratio represented by $Na_2O(Na_2O+K_2O)$ to a value in the range of 0.01-0.99, the alkali components are inhibited from moving and, hence, the low-dielectric-loss characteristics of the glass substrate 2 can be enhanced. The molar ratio represented by $Na_2O/(Na_2O+K_2O)$ is more preferably 0.98 or less, even more preferably 0.95 or less, especially preferably 0.9 or less. The molar ratio represented by $Na_2O/(Na_2O+K_2O)$ is more preferably 0.02 or higher, even more preferably 0.05 or higher, especially preferably 0.1 or higher.

The glass substrate 2 is made to satisfy requirement (2), concerning the content and proportion of $Al_2O_3$ and $B_2O_3$, or requirement (3), concerning the content of alkaline earth metal oxides, or to satisfy both requirement (2) and requirement (3), in addition to the requirement (1), which specifies the content of alkali metal oxides and a proportion of alkali metal oxides. Thus, the glass substrate 2 can be made to have a dielectric dissipation factor at 35 GHz of 0.007 or less. With respect to requirement (2), $Al_2O_3$ is not essential. However, $Al_2O_3$ is a component which is effective in improving the weatherability, inhibiting the glass from separating into phases, lowering the thermal expansion coefficient, etc., and the content thereof is preferably in the range of 0-15%. $B_2O_3$ is a component which is effective in improving glass meltability, lowering the devitrification temperature, etc., and the content thereof is preferably in the range of 9-30%.

With respect to requirement (2), in cases when the molar ratio represented by $Al_2O_3/(Al_2O_3+B_2O_3)$ is 0.45 or less, the low-dielectric-loss characteristics of the glass substrate 2 can be heightened. The molar ratio represented by $Al_2O_3/(Al_2O_3+B_2O_3)$ may be 0. The molar ratio represented by $A_{23}/(Al_2O_3+B_2O_3)$ is more preferably 0.4 or less, even more preferably 0.3 or less. The molar ratio represented by $Al_2O_3/(Al_2O_3+B_2O_3)$ is preferably 0.01 or higher, more preferably 0.05 or higher.

In cases when the total content of $Al_2O_3$ and $B_2O_3$ (including the case where the content of $Al_2O_3$ is 0) is 1% or higher, the glass can have enhanced meltability, etc. The total content of $Al_2O_3$ and $B_2O_3$ is more preferably 3% or higher, even more preferably 5% or higher, especially preferably 7% or higher. In cases when the total content of $Al_2O_3$ and $B_2O_3$ (including the case where the content of $Al_2O_3$ is 0) is 40% or less, the low-dielectric-loss characteristics of the glass substrate 2 can be enhanced while maintaining glass meltability, etc. The total content of $Al_2O_3$ and $B_2O_3$ is more preferably 37% or less, even more preferably 35% or less, especially preferably 33% or less.

In cases when the content of $Al_2O_3$ is 15% or less, glass meltability and other properties can be rendered satisfactory. The content of $Al_2O$ is more preferably 14% or less. The content of $Al_2O_3$ is more preferably 0.5% or higher. In cases when the content of $B_2O_3$ is 30% or less, the glass substrate can have satisfactory acid resistance and a satisfactory strain point. The content of $B_2O_3$ is more preferably 28% or less, even more preferably 26% or less, especially preferably 24% or less, most preferably 23% or less. Meanwhile, in cases when the content of $B_2O_3$ is 9% or higher, the meltability can be improved. The content of $B_2O$ is more preferably 13% or higher, even more preferably 16% or higher.

With respect to requirement (3), examples of the alkaline earth metal oxides include MgO, CaO, SrO, and BaO. These oxides each function as a component which enhances glass meltability. In cases when the total content of such alkaline earth metal oxides is 13% or less, the glass substrate 2 can have enhanced low-dielectric-loss characteristics. The total content of alkaline earth metal oxides is more preferably 11% or less, even more preferably 10% or less, especially preferably 8% or less, most preferably 6% or less. Meanwhile, in cases when the total content of alkaline earth metal oxides is 0.1% or higher, satisfactory glass meltability can be maintained. The total content of alkaline earth metal oxides is more preferably 3% or higher, even more preferably 5% or higher.

MgO, although not essential, is a component which heightens the Young's modulus without increasing the specific gravity. Namely, MgO is a component capable of heightening the specific modulus, thereby mitigating the problem of deflection and improving the fracture toughness to enhance the glass strength. MgO is also a component which improves meltability. The content of MgO, which is not an essential component, is preferably 0.1% or higher, more preferably 1% or higher, even more preferably 3% or higher. In cases when the content of MgO is 0.1% or higher, the effects of the inclusion of MO can be sufficiently obtained and the thermal expansion coefficient can be inhibited from becoming too low. The content of MgO is preferably 13% or less, more preferably 11% or less, even more preferably 9% or less. In cases when the content of MgO is 13% or less, the devitrification temperature can be inhibited from rising.

CaO is a component which has the feature of being next to MgO, among the alkaline earth metal oxides, in heightening the specific modulus and of not excessively lowering the strain point and which improves meltability like MgO. CaO further has the feature of being less apt to heighten the devitrification temperature as compared with MgO. The content of CaO, which is not an essential component, is preferably 0.1% or higher, more preferably 1% or higher, even more preferably 3% or higher. In cases when the content of CaO is 0.1% or higher, the effects of the inclusion of CaO can be sufficiently obtained. The content of CaO is preferably 13% or less, more preferably 10% or less, even more preferably 8% or less. In cases when the content of CaO is 13% or less, the glass is prevented from having too high an average thermal expansion coefficient and is inhibited from increasing in devitrification temperature, thereby preventing devitrification during glass production.

SrO is a component which improves meltability without heightening the devitrification temperature of the glass. The content of SrO, which is not an essential component, is desirably 0.1% or higher, preferably 0.5% or higher, more preferably 1.0% or higher, even more preferably 1.5% or higher, especially preferably 2% or higher. In cases when the content of SrO is 0.1% or higher, the effect of the inclusion of SrO can be sufficiently obtained. The content of SrO is preferably 13% or less, more preferably 10% or less, even more preferably 7% or less, especially preferably 5% or less. In cases when the content of SrO is 13% or less, the glass can be prevented from having too high a specific gravity and be inhibited from having too high an average thermal expansion coefficient.

BaO, although not essential, is a component which improves meltability without heightening the devitrification temperature of the glass. However, in case where BaO is contained in too large an amount, the glass tends to have too high a specific gravity, a reduced Young's modulus, an increased relative permittivity, and too high an average thermal expansion coefficient. Because of this, the content of BaO is desirably 10% or less, preferably 8% or less, more preferably 5% or less, even more preferably 3% or less. It is especially preferable that the glass substrate contains substantially no BaO.

In this description, the wording "containing substantially no . . . " means that the ingredient is not contained except for that which has come into the glass as an unavoidable impurity from raw materials, etc. Namely, that wording means that the ingredient is not incorporated on purpose. In the present invention, the expression "the glass contains substantially no BaO" means that the content thereof is, for example, 0.3% or less.

As described above, in cases when requirement (2) or (3) is satisfied besides requirement (1), the glass substrate 2 can have a dielectric dissipation factor at 35 GHz of 0.007 or less and can have a reduced dielectric loss. From the standpoint of further enhancing the low-dielectric-loss characteristics of the glass substrate 2, it is more preferable that the glass substrate 2 satisfies all of requirement (1), requirement (2), and requirement (3).

The content of $SiO_2$, among the constituent components of the glass substrate 2, that is a main component and serves as a network-forming substance is preferably in the range of 40-75%. In cases when the content of $SiO_2$ is 40% or higher, satisfactory glass-forming ability and satisfactory weatherability can be obtained and devitrification can be inhibited. The content of $SiO_2$ is more preferably 45% or higher, even more preferably 50% or higher, especially preferably 55% or higher. Meanwhile, in cases when the content of $SiO_2$ is 75% or less, satisfactory glass meltability can be attained. The content of $SiO_2$ is more preferably 74% or less, even more preferably 73% or less, especially preferably 72% or less.

The glass substrate 2 may contain $Fe_2O_3$, $TiO_2$, $ZrO_2$, ZnO, $Ta_2O_5$, $WO_3$, $Y_2O_3$, $La_2O_3$, etc. as optional components, besides the components described above. $Fe_2O_3$ is a component for controlling the light-absorbing performance of the glass substrate 2, such as, for example, infrared-absorbing performance or ultraviolet-absorbing performance. The glass substrate 2 can contain Fe, in terms of $Fe_2O_3$, in an amount of up to 0.012% according to need. In cases when that content of Fe is 0.012% or less, the glass substrate 2 can retain the low-dielectric-loss characteristics and ultraviolet transmittance. From the standpoint of improving the ultraviolet transmittance, the content of Fe is more preferably 0.01% or less, even more preferably 0.005% or less. By heightening the ultraviolet transmittance of the glass substrate 2, it is rendered possible to use an ultraviolet-curing material in, for example, stacking steps in high-frequency device production steps, thereby heightening the efficiency of producing high-frequency devices.

Meanwhile, by making the glass substrate 2 contain Fe, in terms of $Fe_2O_3$, in an amount of 0.05% or larger according to need, the ultraviolet-shielding ability thereof can be enhanced. The content of Fe is more preferably 0.07% or higher, even more preferably 0.1% or higher. The enhanced ultraviolet-shielding ability of the glass substrate 2 makes the glass substrate 2 capable of functioning as a protective material in the case of using a resin member which is deteriorated by ultraviolet light.

From the standpoint of further improving the low-dielectric-loss characteristics of the glass substrate 2, it is preferable that the glass substrate 2 has a β-OH value in the range of 0.05-0.6 $mm^{-1}$. β-OH is a value used as an index to the water content of the glass, and is determined by examining a glass sample for the absorbance of light having a wavelength of 2.75-2.95 μm and dividing the maximum value thereof $β_{max}$ by the thickness (mm) of the sample. By regulating the β-OH value of the glass substrate 2 to 0.6 $mm^{-1}$ or less, the low-dielectric-loss characteristics of the glass substrate 2 can be further improved. The β-OH value of the glass substrate 2 is more preferably 0.5 $mm^{-1}$ or less, even more preferably 0.4 $mm^{-1}$ or less. Meanwhile, in cases when the β-OH value of the glass substrate 2 is 0.05 $mm^{-1}$ or larger, there is no need of performing melting in an extremely dry atmosphere or excessively reducing the water content of the raw materials and it is possible to heighten the glass production efficiency and enhance bubble-free quality etc. of the glass. The β-OH value of the glass substrate 2 is more preferably 0.1 $mm^{-1}$ or larger, even more preferably 0.2 $mm^{-1}$ or larger.

The glass substrate 2 has a thermal expansion coefficient suitable for electronic devices, depending on, for example, the contents of alkali metal oxides and alkaline earth metal oxides. Specifically, the average thermal expansion coefficient thereof over the range of from 50° C. to 350° C. is in the range of 3-15 ppm/° C. In cases when the glass substrate 2 having such a thermal expansion coefficient is used in configuring, for example, a semiconductor package as a high-frequency device, it is possible to more properly regulate the difference in thermal expansion coefficient between this glass substrate 2 and other members. For example, the difference in thermal expansion coefficient between this glass substrate 2 and other members. e.g., semiconductor chips, can be more properly regulated in configuring a through-glass via substrate (TGV substrate) of the 2.5-D or 3-D (three dimensional) mounting type for high-frequency applications.

Furthermore, the glass substrate 2 preferably has a Young's modulus of 40 GPa or higher. In cases when the glass substrate 2 having such a Young's modulus is caused to run in steps (wafer process) for producing a high-frequency device, the deflection amount can be reduced to, for example, 1 mm or less, making it possible to inhibit the occurrence of high-frequency device production failures, etc. The Young's modulus of the glass substrate 2 is more preferably 50 GPa or higher, even more preferably 55 GPa or higher. The glass substrate 2 preferably has a porosity of 0.1% or less. Due to this, high-frequency devices produced using the glass substrate 2 can be inhibited from making noises, etc. The porosity of the glass substrate 2 is more preferably 0.01% or less, even more preferably 0.001% or less.

The glass substrate 2 preferably has a transmittance at 350-nm wavelength of 50% or higher. The glass substrate 2 having such transmittance makes it possible to use an ultraviolet-curing material in, for example, stacking steps in high-frequency device production steps, thereby heightening the efficiency of producing high-frequency devices. From the standpoint of shortening the period of irradiating the ultraviolet-curing material with ultraviolet light in a device production step and reducing the thickness-direction unevenness in the curing of the ultraviolet-curing material, it is more preferable that the transmittance at 350-nm wavelength of the glass substrate 2 is 70% or higher.

For the same reason, the transmittance at 300-nm wavelength of the glass substrate 2 is preferably 50% or higher, more preferably 60% or higher, even more preferably 70% or higher. The transmittance at 250-nm wavelength of the glass substrate 2 is preferably 5% or higher, more preferably 10% or higher, even more preferably 20% or higher.

The transmittance at 350-nm wavelength of the glass substrate 2 is preferably 80% or less. Thus, the glass substrate 2 can be made to have ultraviolet-shielding ability and to function as a protective material for the case where a resin which is deteriorated by ultraviolet light is used as a member. The transmittance at 350-nm wavelength of the glass substrate 2 is more preferably 60% or less, even more preferably 30% or less, most preferably 10% or less.

For the same reason, the transmittance at 300-nm wavelength of the glass substrate 2 is preferably 80% or less, more preferably 60% or less, even more preferably 30% or less, most preferably 10% or less. The transmittance at 250-nm wavelength of the glass substrate 2 is preferably 60% or less, more preferably 30% or less, even more preferably 10% or less, most preferably 5% or less.

The glass substrate 2 is not particularly limited in the shape thereof. However, the thickness thereof is preferably in the range of 0.05-1 mm, and each main surface of the glass substrate 2 preferably has an area of 225-10,000 cm². In cases when the thickness of the glass substrate 2 is 1 mm or less, it is possible to attain thickness and size reductions in high-frequency devices, an improvement in the efficiency of producing high-frequency devices, etc. Furthermore, the glass substrate 2 can have a heightened ultraviolet transmittance, making it possible to heighten the efficiency of device production by using an ultraviolet-curing material in device production steps. The thickness of the glass substrate 2 is more preferably 0.5 mm or less. Meanwhile, in cases when the thickness of the glass substrate 2 is 0.05 mm or larger, this glass substrate 2 can retain the strength, etc. when caused to nm. In addition, this glass substrate 2 can have enhanced ultraviolet-shielding ability and can protect resins which are deteriorated by ultraviolet light. The thickness of the glass substrate 2 is more preferably 0.1 mm or larger, even more preferably larger than 0.2 mm. Moreover, a glass substrate 2 according to an embodiment can be provided in a substrate size which includes the thickness shown above and an area of 10,000 cm². It is hence possible to cope with a panel size increase, etc. The area of the glass substrate 2 is more preferably 3.600 cm² or less.

The glass substrate 2 preferably has a devitrification temperature of 1.400° C. or lower. In cases when the devitrification temperature thereof is 1,400° C. or lower, glass forming can be conducted using a forming apparatus in which the members have lowered set temperatures and can have a prolonged life. The devitrification temperature thereof is more preferably 1,350° C. or lower, even more preferably 1,330° C. or lower, especially preferably 1,300° C. or lower. The devitrification temperature of a glass is determined in the following manner. Crushed particles of the glass are placed on a platinum dish and heat-treated for 17 hours in an electric furnace controlled so as to have a constant temperature. The heat-treated sample is examined with an optical microscope to determine both a highest temperature at which crystal precipitation has occurred in the surface and inside of the glass and a lowest temperature at which crystal precipitation has occurred in neither the glass surface nor the inside thereof. The highest and lowest temperatures are averaged, and the average value is taken as the devitrification temperature.

Next, a process for producing a glass substrate according to an embodiment is explained. In the case of producing the glass substrate according to an embodiment, the glass substrate is produced through: a melting step in which raw glass materials are heated to obtain a molten glass; a refining step in which bubbles are removed from the molten glass; a forming step in which the molten glass is formed into a sheet shape to obtain a glass ribbon; and an annealing step in which the glass ribbon is gradually cooled to a room-temperature state. Alternatively, use may be made of a method in which the molten glass is formed into a block, annealed, and then subjected to cutting and polishing to produce the glass substrate.

In the melting step, raw materials are prepared so as to result in a desired composition of the glass substrate, and the raw materials are continuously introduced into a melting furnace and heated to preferably about 1,450-1,750° C. to obtain a molten glass.

As the raw materials, use can be made of oxides, carbonates, nitrates, hydroxides, halides such as chlorides, and the like. In cases when the process includes a step in which the molten glass comes into contact with platinum as in the melting or refining step, fine platinum particles may come into the molten glass and be included as foreign matter in the glass substrate obtained. Use of nitrates as raw materials has the effect of preventing the inclusion of platinum as foreign matter.

Usable as the nitrates are strontium nitrate, barium nitrate, magnesium nitrate, calcium nitrate, and the like. More preferred is to use strontium nitrate. With respect to the particle size of the raw materials, use may be suitably made of raw materials ranging from raw materials having such a large particle diameter of several hundred micrometers that the particles do not remain unmelted to raw materials having such a small particle diameter of several micrometers that the particles neither fly off during raw-material conveyance nor aggregate into secondary particles. Use of granules is possible. The water content of the raw materials can be suitably regulated in order to prevent the raw materials from flying off. Melting conditions including β-OH and the degree of oxidation/reduction of Fe (redox [$Fe^{2+}/(Fe^{2+}+Fe^{3+})$]) can also be suitably regulated.

The subsequent refining step is a step in which bubbles are removed from the molten glass obtained in the melting step. In the refining step, a method of degassing under reduced pressure may be used, or degassing may be conducted by heating the molten glass to a temperature higher than the temperature used for melting the raw materials. In a step for producing a glass substrate according to an embodiment, $SO_3$ or $SnO_2$ can be used as a refining agent. Preferred $SO_3$ sources are the sulfates of at least one element selected from among Al, Na, K, Mg, Ca, Sr, and Ba. More preferred are the sulfates of the alkaline earth metals. Preferred of these are $CaSO_4 \cdot 2H_2O$, $SrSO_4$, and $BaSO_4$, because these sulfates are highly effective in enlarging bubbles.

As a refining agent for the method for degassing performed under reduced pressure, it is preferred to use a halogen such as Cl or F. Preferred Cl sources are the chlorides of at least one element selected from among Al, Mg, Ca, Sr. and Ba. More preferred are the chlorides of the alkaline earth metals. Especially preferred of these are $SrCl_2 \cdot 6H_2O$ and $BaCl_2 \cdot 2H_2O$, because these chlorides are highly effective in enlarging bubbles and have low deliquescence. Preferred F sources are the fluorides of at least one element selected from among Al, Na, K, Mg, Ca, Sr, and Ba. More preferred are the fluorides of the alkaline earth metals. Even more preferred of these is $CaF_2$, because this fluoride is highly effective in enhancing the meltability of raw glass materials.

Tin compounds represented by $SnO_2$ evolve OZ gas in molten glasses. In molten glasses, $SnO_2$ at a temperature of 1,450° C. or higher has the function of being reduced to SnO to evolve $O_2$ gas, thereby enlarging the bubbles. In producing the glass substrate 2 according to an embodiment, the raw glass materials are melted by heating to about 1.450-1,750° C. and, hence, the bubbles in the molten glass are more effectively enlarged. In the case of using $SnO_2$ as a refining agent, the raw materials are prepared so that tin compounds are contained in an amount of 0.01% or larger in terms of $SnO_2$ based on the whole glass matrix composition, which is taken as 100%. In cases when the content of $SnO_2$ is 0.01% or higher, the refining function is obtained in melting the raw glass materials. The content thereof is preferably 0.05% or higher, more preferably 0.10% or higher. Incases when the content of $SnO_2$ is 0.3% or less, the glass is inhibited from being colored or devitrified. The content of tin compounds in the alkali-free glass is more preferably 0.25% or less, even more preferably 0.2% or less, especially preferably 0.15% or less, in terms of $SnO_2$ based on the whole glass matrix composition, which is taken as 100%.

The subsequent forming step is a step in which the molten glass from which bubbles have been removed in the refining step is formed into a sheet shape to obtain a glass ribbon. In the forming step, a known technique for forming a glass into a sheet shape can be used, such as, for example, the float process, in which a molten glass is poured onto a molten metal, e.g., tin, to obtain a sheet-shaped glass ribbon, an overflow downdraw process (fusion process) in which a molten glass is caused to flow downward from a trough member, or a slit downdraw process in which a molten glass is caused to flow down through a slit.

Next, the annealing step is a step in which the glass ribbon obtained in the forming step is cooled to a room-temperature state under controlled cooling conditions. In the annealing step, the glass ribbon is cooled from the annealing point to the strain point at an average cooling rate of R and then further cooled gradually to a room-temperature state under given conditions. The annealed glass ribbon is cut to obtain a glass substrate.

In case where the cooling rate R in the annealing step is too high, the cooled glass is prone to have a residual strain. In addition, the equivalent cooling rate, which is a parameter that reflects a fictive temperature, becomes too high, making it impossible to obtain low-dielectric-loss characteristics. It is hence preferred to set the R so as to result in an equivalent cooling rate of 800° C./min or less. The equivalent cooling rate is more preferably 400° C./min or less, even more preferably 100° C./min or less, especially preferably 50° C./min or less. Meanwhile, in case where the cooling rate is too low, there is a problem in that the step requires too long a time period, resulting in a decrease in production efficiency. It is hence preferred to set the cooling rate at 0.1° C./min or higher. The cooling rate is more preferably 0.5° C./min or higher, even more preferably 1° C./min or higher.

A definition of the equivalent cooling rate and a method for evaluation thereof are as follows. A glass having a composition to be examined and having been processed into a rectangular parallelepiped of 10 mm×10 mm×0.3-2.0 mm is held at [strain point+170° C.] for 5 minutes using an infrared-heating electric furnace and then cooled to room temperature (25° C.). This operation is conducted to produce a plurality of glass samples by performing the cooling at various cooling rates ranging from 1 to 1,000° C./min.

A precision refractometer (e.g., KPR2000, manufactured by Shimadzu Device Corp.) is used to measure the refractive index $n_d$ for d-line (wavelength, 587.6 nm) of each of the plurality of glass samples. For the measurement, use may be made of a V-block method or a minimum deviation method. The obtained values of $n_d$ are plotted against the logarithm of the cooling rates, thereby obtaining a calibration curve regarding a relationship between $n_d$ and cooling rate.

Next, a glass having the same composition and actually produced through the steps of melting, forming, cooling, etc. is examined for $n_d$ by the measuring method shown above. A cooling rate corresponding to the $n_d$ obtained (the cooling rate being referred to as equivalent cooling rate in this embodiment) is determined from the calibration curve.

The present invention is not limited to the embodiments described above. Modifications, improvements, and the like made within the range where the objects of the present invention can be achieved are included in the present invention. For example, in the case of producing a glass substrate according to the present invention, a plate-shaped glass may be obtained by press forming, in which a molten glass is directly formed into a plate shape.

Furthermore, for producing a glass substrate according to the present invention, a crucible made of platinum or of an alloy including platinum as a main component (hereinafter referred to as a platin umcrucible) may be used as a melting vessel or a refining vessel, besides the production process in which a melting vessel made of a refractory is used. In the case of using a platinum crucible, a melting step may be performed in the following manner. Raw materials are prepared so as to result in the composition of the glass substrate to be obtained, and the platinum crucible containing the raw materials is heated in an electric furnace to preferably about 1,450-1,700° C. A platinum stirrer is inserted thereinto to stir the contents for 1-3 hours, thereby obtaining a molten glass.

In a forming step among steps for glass substrate production with the platinum crucible, the molten glass is poured out, for example, onto a carbon plate or into a casting mold to form the molten glass into a plate or block shape. In an annealing step, the formed glass is held at a temperature of typically about Tg+50° C., subsequently cooled to around the strain point at a rate of about 1-10° C./min, and then cooled to a room-temperature state at such a cooling rate that no strain remains. The cooled glass is cut into a given shape and polished to obtain a glass substrate. The glass substrate obtained by the cutting may be heated, for example, to a temperature of about Tg+50° C. and then gradually cooled to a room-temperature state at a given cooling rate. Thus, the equivalent cooling temperature of the glass can be regulated.

The circuit board 1 employing the above-described glass substrate 2 according to an embodiment is suitable for use in high-frequency devices in which high-frequency signals, in particular, high-frequency signals having a frequency exceeding 30 GHz and even high-frequency signals of 35 GHz or higher, are processed. This circuit board 1 can reduce the transmission loss of such high-frequency signals to improve the quality, intensity, and other properties of the high-frequency signals. The glass substrate 2 and the circuit board 1 according to an embodiment are suitable for high-frequency devices (electronic devices) such as semiconductor devices for use in communication appliances, such as, for example, cell phones, smartphones, personal digital assistants, and Wi-Fi appliances, and for surface acoustic wave (SAW) devices, radar components such as radar transceivers, antenna components such as liquid-crystal antennas, etc.

EXAMPLES

The present invention is explained below in detail by reference to Examples, but the present invention is not limited to the following Examples. Examples 1 to 3 and 7 to 25 are working examples according to the present invention, and Examples 4 to 6 are comparative examples.

Examples 1 to 3 and 7 to 25

Glass substrates respectively having the compositions shown in Tables 1 to 4 and each having a thickness of 0.125 mm, a shape of 50 mm×50 mm, and an arithmetic average roughness Ra of the main surfaces of 1.0 nm were prepared. Each glass substrate was produced by a melting method using a platinum crucible. Raw materials including silica sand were mixed so as to result in 1 kg in terms of glass weight, thereby producing a batch. A sulfate was added thereto in an amount of 0.1-1% in terms of $SO_3$ and in terms of mole percent on the basis of oxides, and 0.16% F and 1% Cl were further added, the amount of the raw materials having the desired composition being taken as 100%. The raw materials were placed in a platinum crucible and melted by heating at a temperature of 1,650° C. in an electric furnace for 3 hours, thereby obtaining a molten glass. In the melting, a platinum stirrer was introduced into the platinum crucible and the contents were stirred for 1 hour to homogenize the glass. The molten glass was poured out onto a carbon plate and formed into a plate shape. Thereafter, the plate-shaped glass was introduced into an electric furnace having a temperature of about Tg+50° C. and held therein for 1 hour. Subsequently, the electric furnace was cooled to Tg−100° C. at a cooling rate of 1° C./min and then allowed to cool until the glass cooled to room temperature. Thereafter, the glass was cut and polished into a plate shape.

The glass substrates of Examples 1 to 3 and 7 to 25 were examined for the average thermal expansion coefficient over the range of from 50° C. to 350 nm, β-OH value, Young's modulus, porosity, transmittance at a wavelength of 350 nm, density, specific modulus, and devitrification temperature, and these properties are shown in Tables 5 to 8. The numerals given in parentheses in the tables are ones determined by calculations. In Tables 9 to 12 are shown the dielectric dissipation factor at 35 GHz, relative permittivity at 35 GHz, wiring line width, transmission loss at 35 GHz, and transmission loss at 110 GHz. As illustrated in FIG. 1, a copper wiring layer having a thickness of 0.125 mm was formed as signal wiring on a first main surface of the glass substrate, and a copper layer having a thickness of 0.125 mm was formed as solid-film ground wiring on a second main surface. The circuit board thus produced was subjected to the property evaluation which will be described later.

Example 4

A soda-lime glass substrate produced by the float process was prepared, the glass substrate having the composition shown in Table 1 and having a thickness of 0.125 mm, a shape of 50 mm×50 mm and an arithmetic average roughness Ra of the main surfaces of 1.0 nm. The properties of the glass substrate of Example 4 are shown in Tables 5 and 9 like those of Example 1. A copper wiring layer having a thickness of 0.125 mm and a copper layer having a thickness of 0.125 mm were formed on both main surfaces of the glass substrate as in Example 1, and the resultant circuit board was subjected to the property evaluation which will be described later.

Example 5

An alkali-free glass substrate produced by the float process was prepared, the glass substrate having the composition shown in Table 1 and having a thickness of 0.125 mm, a shape of 50 mm×50 mm, and an arithmetic average roughness Ra of the main surfaces of 1.0 nm. The properties of the glass substrate of Example 5 are shown in Tables 5 and 9 like those of Example 1. A copper wiring layer having a thickness of 0.125 mm and a copper layer having a thickness of 0.125 mm were formed on both main surfaces of the glass substrate as in Example 1, and the resultant circuit board was subjected to the property evaluation which will be described later.

Example 6

A quartz glass substrate produced by a vapor-phase synthesis method was prepared, the glass substrate having the composition shown in Table 1 and having a thickness of 0.125 mm, a shape of 50 mm×50 mm, and an arithmetic average roughness Ra of the main surfaces of 1.0 nm. In the composition shown in Table 1, "0" indicates that the content of the component is less than 0.05%. The properties of the glass substrate of Example 6 are shown in Tables 5 and 9 like those of Example 1. A copper wiring layer having a thickness of 0.125 mm and a copper layer having a thickness of 0.125 mm were formed on both main surfaces of the glass substrate as in Example 1, and the resultant circuit board was subjected to the property evaluation which will be described below.

Methods for determining the properties are shown below.

(Relative Permittivity, Dielectric Dissipation Factor)

A cavity resonator and a vector network analyzer were used to make a measurement in accordance with the method as provided for in JIS R1641 (year 2007). The measuring frequency was 35 GHz, which was the air resonance frequency for the cavity resonator.

(Average Thermal Expansion Coefficient)

A differential thermodilatometer was used to make a measurement in accordance with the method as provided for in JIS R3102 (year 1995). The measurement was made over a temperature range of 50-350° C. The unit is ppm/° C.

(Young's Modulus)

A glass having a thickness of 0.5-10 mm was examined for Young's modulus by an ultrasonic pulse method in accordance with the method as provided for in JIS Z 2280. The unit is GPa.

(Transmittance)

A visible and ultraviolet spectrophotometer was used to measure the transmittance of a mirror-polished glass having a given thickness. The transmittance was shown in terms of external transmittance including a loss due to reflection.

(Porosity)

A glass substrate was examined for bubbles contained therein with an optical microscope to determine the number of the bubbles and the diameters thereof. The volume of bubbles contained per unit volume was calculated to thereby determine the porosity.

($\beta$-OH)

$\beta$-OH was determined by the method described hereinabove with regard to an embodiment.

(Ra)

The average roughness of a 10-μm-square region in a glass surface was determined with an AFM in accordance with the method as provided for in JIS B0601 (year 2001).

(Density)

Glass masses weighing about 20 g and containing no bubbles were examined for density by Archimedes' method.

(Devitrification Temperature)

Crushed particles of a glass were placed on a platinum dish and heat-treated for 17 hours in an electric furnace controlled so as to have a constant temperature. The heat-treated sample was examined with an optical microscope, and the highest temperature at which crystal precipitation occurred in the inside of the glass and the lowest temperature at which no crystal precipitation occurred in the inside of the glass were averaged. The average value was taken as the devitrification temperature.

TABLE 1

|  |  | Example 1 | Example 2 | Example 3 | Example 4 | Example 5 | Example 6 |
|---|---|---|---|---|---|---|---|
| Composition [mol %] | $SiO_2$ | 68.0 | 69.5 | 71.0 | 71.1 | 66.1 | 100 |
|  | $Al_2O_3$ | 4.0 | 5.5 | 4.0 | 1.1 | 11.3 | 0 |
|  | $B_2O_3$ | 21.0 | 15.0 | 21.3 | 0 | 7.8 | 0 |
|  | $Al_2O_3 + B_2O_2$ | 25.0 | 20.5 | 25.3 | 1.1 | 19.1 | 0 |
|  | MgO | 0 | 3.0 | 0 | 6.9 | 5.1 | 0 |
|  | CaO | 1.0 | 4.0 | 0 | 8.3 | 4.5 | 0 |
|  | SrO | 6.0 | 3.0 | 3.8 | 0 | 5.2 | 0 |
|  | BaO | 0 | 0 | 0 | 0 | 0 | 0 |
|  | Total content RO*1 | 7.0 | 10.0 | 3.8 | 15.2 | 14.8 | 0 |
|  | $Na_2O$ | 0.009 | 0.007 | 0.012 | 12.4 | 0.07 | 0 |
|  | $K_2O$ | 0.003 | 0.004 | 0.006 | 0.2 | 0.01 | 0 |
|  | Total content $R_2O$*2 | 0.012 | 0.011 | 0.018 | 12.6 | 0.08 | 0 |
|  | $Fe_2O_3$ | 0.002 | 0.001 | 0.003 | 0.04 | 0.003 | 0 |
| Proportion | $Al_2O_3/(Al_2O_3 + B_2O_3)$ | 0.16 | 0.27 | 0.16 | 1 | 0.59 | — |
|  | $Na_2O/(Na_2O + K_2O)$ | 0.75 | 0.64 | 0.67 | 0.98 | 0.88 | — |

*1 Total content of alkaline earth metal oxides.
*2 Total content of alkali metal oxides.

TABLE 2

|  |  | Example 7 | Example 8 | Example 9 | Example 10 | Example 11 | Example 12 |
|---|---|---|---|---|---|---|---|
| Composition [mol %] | $SiO_2$ | 62.0 | 60.0 | 60.0 | 58.0 | 62.0 | 58.0 |
|  | $Al_2O_3$ | 10.0 | 10.0 | 10.0 | 10.0 | 8.0 | 10.0 |
|  | $B_2O_3$ | 21.0 | 23.0 | 26.0 | 26.0 | 23.0 | 25.0 |
|  | $Al_2O_3 + B_2O_3$ | 31.0 | 33.0 | 36.0 | 36.0 | 31.0 | 35.0 |
|  | MgO | 2.0 | 2.0 | 1.0 | 3.0 | 2.0 | 2.0 |
|  | CaO | 3.0 | 3.0 | 2.0 | 2.0 | 3.0 | 3.0 |
|  | SrO | 2.0 | 2.0 | 1.0 | 1.0 | 2.0 | 2.0 |
|  | BaO | 0 | 0 | 0 | 0 | 0 | 0 |
|  | Total content RO*1 | 7.0 | 7.0 | 4.0 | 6.0 | 7.0 | 7.0 |
|  | $Na_2O$ | 0.010 | 0.015 | 0.008 | 0.003 | 0.005 | 0.005 |
|  | $K_2O$ | 0.003 | 0.003 | 0.005 | 0.001 | 0.001 | 0.001 |
|  | Total content $R_2O$*2 | 0.013 | 0.018 | 0.013 | 0.004 | 0.006 | 0.006 |
|  | $Fe_2O_3$ | 0.008 | 0.007 | 0.006 | 0.007 | 0.008 | 0.009 |
| Proportion | $Al_2O_3/(Al_2O_3 + B_2O_3)$ | 0.32 | 0.30 | 0.28 | 0.28 | 0.26 | 0.29 |
|  | $Na_2O/(Na_2O + K_2O)$ | 0.77 | 0.83 | 0.62 | 0.75 | 0.83 | 0.83 |

*1 Total content of alkaline earth metal oxides.
*2 Total content of alkali metal oxides.

TABLE 3

|  |  | Example 13 | Example 14 | Example 15 | Example 16 | Example 17 | Example 18 |
|---|---|---|---|---|---|---|---|
| Composition [mol %] | $SiO_2$ | 60.0 | 60.0 | 60.0 | 60.0 | 60.0 | 60.0 |
|  | $Al_2O_3$ | 8.0 | 10.0 | 5.0 | 2.0 | 0 | 0 |
|  | $B_2O_3$ | 25.0 | 23.0 | 28.0 | 31.0 | 33.0 | 36.0 |
|  | $Al_2O_3 + B_2O_3$ | 33.0 | 33.0 | 33.0 | 33.0 | 33.0 | 36.0 |
|  | MgO | 2.0 | 4.0 | 2.0 | 2.0 | 2.0 | 1.0 |
|  | CaO | 3.0 | 2.0 | 3.0 | 3.0 | 3.0 | 2.0 |
|  | SrO | 2.0 | 1.0 | 2.0 | 2.0 | 2.0 | 1.0 |
|  | BaO | 0 | 0 | 0 | 0 | 0 | 0 |
|  | Total content RO*1 | 7.0 | 7.0 | 7.0 | 7.0 | 7.0 | 4.0 |
|  | $Na_2O$ | 0.005 | 0.005 | 0.005 | 0.005 | 0.005 | 0.005 |
|  | $K_2O$ | 0.001 | 0.001 | 0.001 | 0.001 | 0.001 | 0.001 |
|  | Total content $R_2O$*2 | 0.006 | 0.006 | 0.006 | 0.006 | 0.006 | 0.006 |
|  | $Fe_2O_3$ | 0.008 | 0.010 | 0.006 | 0.006 | 0.005 | 0.005 |
| Proportion | $Al_2O_3/(Al_2O_3 + B_2O_3)$ | 0.24 | 0.30 | 0.15 | 0.06 | 0 | 0 |
|  | $Na_2O/(Na_2O + K_2O)$ | 0.83 | 0.83 | 0.83 | 0.83 | 0.83 | 0.83 |

*1Total content of alkaline earth metal oxides.
*2Total content of alkali metal oxides.

TABLE 4

|  |  | Example 19 | Example 20 | Example 21 | Example 22 | Example 23 | Example 24 | Example 25 |
|---|---|---|---|---|---|---|---|---|
| Composition [mol %] | $Si_2O_3$ | 60.0 | 63.0 | 62.0 | 64.0 | 65.0 | 62.0 | 64.0 |
|  | $Al_2O_3$ | 10.0 | 8.0 | 8.0 | 9.0 | 10.0 | 7.2 | 8.5 |
|  | $B_2O_3$ | 21.0 | 16.0 | 23.0 | 18.5 | 14.0 | 23.0 | 18.5 |
|  | $Al_2O_3 + B_2O_3$ | 31.0 | 24.0 | 31.0 | 27.5 | 24.0 | 30.2 | 27.0 |
|  | MgO | 2.0 | 4.0 | 4.0 | 2.5 | 4.0 | 4.3 | 2.5 |
|  | CaO | 3.0 | 5.0 | 2.0 | 3.5 | 5.0 | 2.5 | 4.0 |
|  | SrO | 4.0 | 3.0 | 1.0 | 2.5 | 2.0 | 1.0 | 2.5 |
|  | BaO | 0 | 1.0 | 0.0 | 0.0 | 0.0 | 0.0 | 0.0 |
|  | Total content RO*1 | 9.0 | 13.0 | 7.0 | 8.5 | 11.0 | 7.8 | 9.0 |
|  | $Na_2O$ | 0.01 | 0.012 | 0.004 | 0.006 | 0.005 | 0.005 | 0.008 |
|  | $K_2O$ | 0.002 | 0.003 | 0.001 | 0.001 | 0.001 | 0.001 | 0.002 |
|  | Total content $R_2O$*2 | 0.012 | 0.015 | 0.005 | 0.007 | 0.006 | 0.006 | 0.010 |
|  | $Fe_2O_3$ | 0.008 | 0.010 | 0.010 | 0.003 | 0.002 | 0.005 | 0.005 |
| Proportion | $Al_2O_3/(Al_2O_3 + B_2O_3)$ | 0.32 | 0.33 | 0.26 | 0.33 | 0.42 | 0.24 | 0.31 |
|  | $Na_2O/(Na_2O + K_2O)$ | 0.83 | 0.80 | 0.80 | 0.86 | 0.83 | 0.83 | 0.80 |

*1Total content of alkaline earth metal oxides.
*2Total content of alkali metal oxides.

TABLE 5

|  | Example 1 | Example 2 | Example 3 | Example 4 | Example 5 | Example 6 |
|---|---|---|---|---|---|---|
| Average thermal expansion coefficient [ppm/° C.] | 3.4 | 3.3 | (2.8) | 8.5 | 3.8 | 0.7 |
| β-OH [$mm^{-1}$] | 0.21 | 0.34 | — | 0.19 | 0.28 | — |
| Young's modulus [GPa] | 58 | 66 | (51) | 73 | 76 | 74 |
| Porosity [%] | 0 | 0 | 0 | 0 | 0 | 0 |
| Transmittance [%] (0.3-0.4 mmt) | 90 | 90 | 90 | 90 | 90 | 93 |
| Density [g/$cm^3$] | 2.32 | 2.34 | (2.24) | 2.49 | 2.50 | 2.20 |
| Specific modulus [GPa · $cm^3$/g] | 25 | 28 | 23 | 29 | 30 | 34 |
| Devitrification temperature [° C.] | ≤1200° C. | ≤1200° C. | ≤1200° C. | ≤1000° C. | 1270 | — |

TABLE 6

|  | Example 7 | Example 8 | Example 9 | Example 10 | Example 11 | Example 12 |
|---|---|---|---|---|---|---|
| Average thermal expansion coefficient [ppm/° C.] | (3.0) | (3.1) | (2.7) | (2.9) | (3.1) | (3.1) |
| β-OH [$mm^{-1}$] | (0.35) | (0.35) | (0.35) | (0.35) | 0.43 | (0.35) |
| Young's modulus [GPa] | 62 | 61 | 58 | 59 | 58 | 59 |
| Porosity [%] | 0 | 0 | 0 | 0 | 0 | 0 |

TABLE 6-continued

|  | Example 7 | Example 8 | Example 9 | Example 10 | Example 11 | Example 12 |
|---|---|---|---|---|---|---|
| Transmittance [%] (0.3-0.4 mmt) | 90 | 90 | 90 | 90 | 90 | 90 |
| Density [g/cm$^3$] | 2.30 | 2.30 | 2.25 | 2.26 | 2.27 | 2.29 |
| Specific modulus [GPa · cm$^3$/g] | 27 | 27 | 26 | 26 | 26 | 26 |
| Devitrification temperature [° C.] | 1330 | 1295 | ≥1420° C. | ≥1420° C. | 1170 | 1310 |

TABLE 7

|  | Example 13 | Example 14 | Example 15 | Example 16 | Example 17 | Example 18 |
|---|---|---|---|---|---|---|
| Average thermal expansion coefficient [ppm/° C.] | (3.1) | (2.9) | (3.2) | (3.3) | (3.4) | (3.0) |
| β-OH [mm$^{-1}$] | 0.48 | (0.35) | 0.52 | (0.35) | (0.35) | (0.35) |
| Young's modulus [GPa] | 57 | 61 | 53 | (42) | (39) | (35) |
| Porosity [%] | 0 | 0 | 0 | 0 | 0 | 0 |
| Transmittance [%] (0.3-0.4 mmt) | 90 | 90 | 90 | — | — | — |
| Density [g/cm$^3$] | 2.27 | 2.28 | 2.23 | (2.20) | (2.17) | (2.11) |
| Specific modulus [GPa · cm$^3$/g] | 25 | 27 | 24 | 19 | 18 | 16 |
| Devitrification temperature [° C.] | 1160 | 1340 | 1040 | — | — | — |

TABLE 8

|  | Example 19 | Example 20 | Example 21 | Example 22 | Example 23 | Example 24 | Example 25 |
|---|---|---|---|---|---|---|---|
| Average thermal expansion coefficient [ppm/° C.] | (3.4) | (3.8) | 3.1 | 3.4 | (3.4) | 3.5 | 3.5 |
| β-OH [mm$^{-1}$] | (0.35) | (0.35) | (0.35) | (0.35) | (0.35) | 0.49 | 0.53 |
| Young's modulus [GPa] | (59) | (64) | (59) | (64) | (70) | 59 | 64 |
| Porosity [%] | 0 | 0 | 0 | 0 | 0 | 0 | 0 |
| Transmittance [%] (0.3-0.4 mmt) | 90 | 90 | 90 | 90 | 90 | 90 | 90 |
| Density [g/cm$^3$] | (2.36) | (2.42) | (2.26) | (2.33) | (2.38) | (2.26) | (2.33) |
| Specific modulus [GPa · cm$^3$/g] | 25 | 26 | 26 | 27 | 29 | 26 | 27 |
| Devitrification temperature [° C.] | — | — | 1230 | 1220 | 1300 | 1230 | 1300 |

(Transmission Loss Calculation Example)

Figure 2:
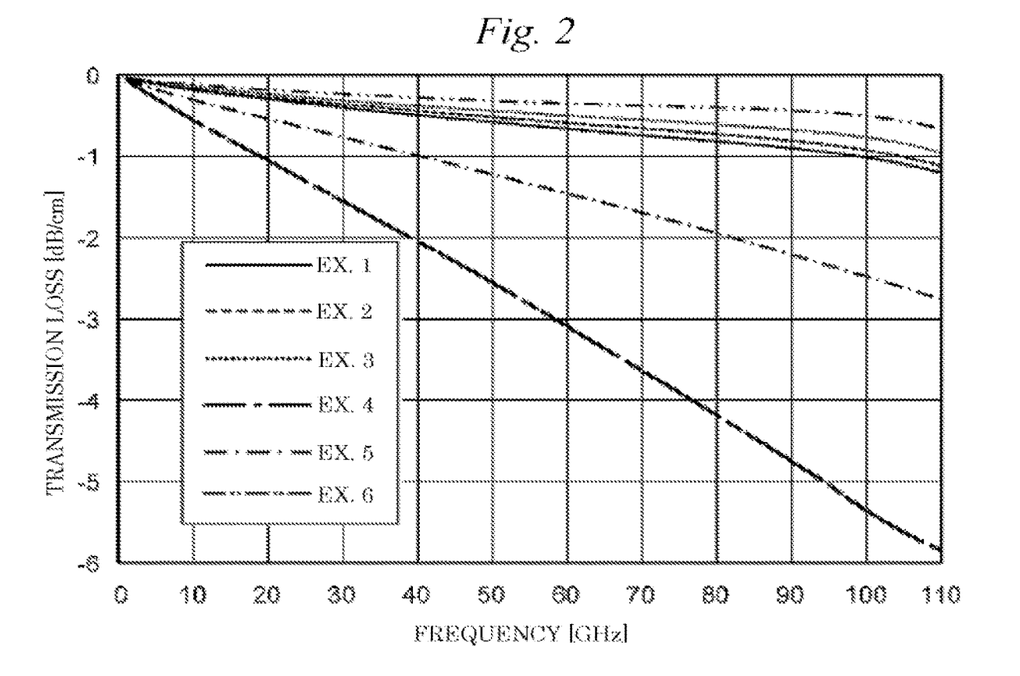
FIG. 2 is a chart which shows relationships between signal frequency and transmission loss in the circuit boards according to Examples 1 to 6.

In order to ascertain the influence of the dielectric properties of the glass substrate materials of Examples 1 to 6 on the transmission loss of high-frequency signals, a transmission loss in a transmission line was calculated using a simplified model. As an analysis method, use was made of commercial moment-method simulator Sonnet Lite® (manufactured by Sonnet Software Inc.). The transmission line was a microstrip line (MSL). The analysis model was as follows. The copper wiring layer formed on one of the main surfaces of the glass substrate was made to have a width (shown in Tables 9 to 12) which resulted in a characteristic impedance for the line of 50Ω, and S parameters (scattering parameters S21) at 1-110 GHz were calculated. The surface roughness of the copper layer was set at such a value that the surface was so smooth that the skin effect was not problematic. The calculated values of S21 (transmission characteristics) are shown in FIG. 2. The values of signal transmission loss at 35 GHz and 110 GHz were shown in Tables 9 to 12.

TABLE 9

|  | Example 1 | Example 2 | Example 3 | Example 4 | Example 5 | Example 6 |
|---|---|---|---|---|---|---|
| Relative permittivity @ 35 GHz | 4.39 | 4.57 | 4.09 | 7.13 | 5.41 | 3.87 |
| Dielectric dissipation factor @ 35 GHz (×10$^{-3}$) | 2.48 | 3.04 | 1.82 | 20.9 | 8.98 | 0.146 |
| Wiring line width [mm] | 0.237 | 0.23 | 0.25 | 0.146 | 0.185 | 0.26 |
| Transmission loss @ 35 GHz [dB/cm] | 0.39 | 0.44 | 0.35 | 1.83 | 0.88 | 0.26 |
| Transmission loss @ 110 GHz [dB/cm] | 1.11 | 1.20 | 0.96 | 5.84 | 2.76 | 0.66 |

TABLE 10

|  | Example 7 | Example 8 | Example 9 | Example 10 | Example 11 | Example 12 |
|---|---|---|---|---|---|---|
| Relative permittivity @ 35 GHz | 4.59 | 4.58 | 4.39 | 4.43 | 4.43 | 4.55 |
| Dielectric dissipation factor @ 35 GHz ($\times 10^{-3}$) | 3.27 | 3.25 | 2.32 | 2.74 | 2.86 | 3.38 |
| Wiring line width [mm] | 0.23 | 0.23 | 0.237 | 0.235 | 0.235 | 0.231 |
| Transmission loss @ 35 GHz [dB/cm] | 0.45 | 0.45 | 0.39 | 0.41 | 0.42 | 0.45 |
| Transmission loss @ 110 GHz [dB/cm] | 1.26 | 1.26 | 1.07 | 1.16 | 1.18 | 1.28 |

TABLE 11

|  | Example 13 | Example 14 | Example 15 | Example 16 | Example 17 | Example 18 |
|---|---|---|---|---|---|---|
| Relative permittivity @ 35 GHz | 4.46 | 4.51 | 4.26 | 4.10 | 3.84 | 3.79 |
| Dielectric dissipation factor @ 35 GHz ($\times 10^{-3}$) | 2.76 | 2.98 | 2.39 | 1.94 | 1.85 | 2.01 |
| Wiring line width [mm] | 0.234 | 0.232 | 0.242 | 0.25 | 0.26 | 0.264 |
| Transmission loss @ 35 GHz [dB/cm] | 0.41 | 0.43 | 0.38 | 0.35 | 0.33 | 0.34 |
| Transmission loss @ 110 GHz [dB/cm] | 1.16 | 1.21 | 1.08 | 0.98 | 0.96 | 0.97 |

TABLE 12

|  | Example 19 | Example 20 | Example 21 | Example 22 | Example 23 | Example 24 | Example 25 |
|---|---|---|---|---|---|---|---|
| Relative permittivity @ 35 GHz | (4.85) | (5.12) | 4.34 | 4.63 | 4.84 | 4.36 | 4.61 |
| Dielectric dissipation factor @ 35 GHz ($\times 10^{-3}$) | (4.23) | (5.44) | 2.64 | 3.40 | 4.80 | 2.63 | 3.56 |
| Wiring line width [mm] | 0.22 | 0.21 | 0.24 | 0.228 | 0.22 | 0.24 | 0.228 |
| Transmission loss @ 35 GHz [dB/cm] | 0.52 | 0.60 | 0.40 | 0.46 | 0.55 | 0.41 | 0.47 |
| Transmission loss @ 110 GHz [dB/cm] | 1.48 | 1.76 | 1.12 | 1.29 | 1.58 | 1.10 | 1.3.2 |

As shown in FIG. 2 and Tables 9 to 12 the circuit boards employing the glass substrates of Examples 1 to 3 and 7 to 25 can have improved transmission characteristics in the high-frequency range as compared with the circuit boards employing the conventional soda-lime glass substrate of Example 4 and the conventional alkali-fee glass substrate of Example 5, and can attain low-transmission-loss characteristics in the high-frequency range which are close to those of the circuit board employing the conventional quartz glass substrate of Example 6. The quartz glass substrate of Example 6 has a thermal expansion coefficient as low as 0.7 ppm/° C. and, hence, when this glass substrate is used for configuring an electronic device, there is an increased difference in thermal expansion coefficient between this glass substrate and other members. A practical electronic device cannot hence be provided therewith. As shown in Example 5, the conventional alkali-free glass substrate, although alkali-free, contains an alkali component in an amount of about 0.05-0.1%.

The glass of Example 21, as an Example for examining ultraviolet transmittance, was modified by changing the content of $Fe_2O_3$, and plates thereof having a thickness of 0.5 mm or 1.0 mm were examined for transmittance at wavelengths of 250, 300, and 350 nm. The results of the examination are shown in Table 13. The transmittance was measured with a visible and ultraviolet spectrophotometer. It can be seen from the results that the ultraviolet transmittance of a glass can be regulated to a desired value by regulating the thickness of the glass plate and the $Fe_2O_3$ content thereof.

TABLE 13

|  | Example 21 |  |  |  |  |  |
|---|---|---|---|---|---|---|
| $Fe_2O_3$ [wt %] | 0.01 | 0.05 | 0.1 | 0.01 | 0.05 | 0.1 |
| Plate thickness [mm] | 1.0 | 1.0 | 1.0 | 0.5 | 0.5 | 0.5 |
| Transmittance [%] @ 250 nm | 12 | 3 | 1 | 31 | 17 | 11 |
| Transmittance [%] @ 300 nm | 82 | 62 | 43 | 86 | 75 | 62 |
| Transmittance [%] @ 350 nm | 90 | 87 | 83 | 91 | 89 | 87 |

INDUSTRIAL APPLICABLY

The glass substrates for a high-frequency device of the present invention have excellent low-dielectric-loss characteristics for high-frequency signals. The circuit board employing the glass substrate having such properties has excellent low-transmission-loss characteristics for high-frequency signals. The glass substrate and the circuit board, which have such properties, are useful in all high-frequency electronic devices in which high-frequency signals having a frequency exceeding 10 GHz, in particular, high-frequency signals having a frequency exceeding 30 GHz and even high-frequency signals of 35 GHz or higher, are processed. For example, the glass substrate and the circuit board are useful in applications such as the glass substrates of communication appliances, frequency filter components such as SAW devices and FBARs, band pass filters such as waveguides, SIW (substrate integrated waveguide) components, radar components, and antenna components (in particular, liquid-crystal antennas optimal for satellite communication).

DESCRIPTION OF REFERENCE NUMERALS AND SIGNS

1 . . . circuit board; 2 . . . glass substrate; 2a, 2b . . . main surfaces; 3, 4 . . . wiring layers.

The invention claimed is:

1. A glass substrate for a high-frequency device, the glass comprising, in terms of mole percent on the basis of oxides:
    40 to 75% of $SiO_2$;
    0 to 15% of $Al_2O_3$;
    13 to 23% of $B_2O_3$;
    2.5 to 11% of MgO; and
    3 to 13% of CaO, and
    having a total content of alkali metal oxides in the range of 0.001-5%,
    wherein at least one main surface of the glass substrate has a surface roughness of 1.5 nm or less in terms of arithmetic average roughness Ra, and the glass substrate has a dielectric dissipation factor at 35 GHz of 0.007 or less.

2. The glass substrate according to claim 1, having a content of Fe, in terms of $Fe_2O_3$, of 0.012% or less in terms of mole percent on the basis of oxides.

3. The glass substrate according to claim 1, having a total content of $Al_2O_3$ and $B_2O_3$ in the range of 24-38% in terms of mole percent on the basis of oxides.

4. The glass substrate according to claim 1, wherein the total content of alkali metal oxides is in the range of 0.001-0.1%.

5. The glass substrate according to claim 1, having a molar ratio represented by $Al_2O_3/(Al_2O_3+B_2O_3)$ in the range of 0-0.45, in terms of mole percent on the basis of oxides.

6. The glass substrate according to claim 1, wherein the alkali metal oxides has a molar ratio represented by $Na_2O/(Na_2O+K_2O)$ in the range of 0.01-0.99.

7. The glass substrate according to claim 1, which is amorphous.

8. The glass substrate according to claim 1, having a β-OH value in the range of 0.05-0.6 $mm^{-1}$.

9. The glass substrate according to claim 1, having a relative permittivity at 35 GHz of 10 or less.

10. The glass substrate according to claim 1, having an average thermal expansion coefficient over the range of from 50° C. to 350° C. in the range of 3-15 ppm/° C.

11. The glass substrate according to claim 1, having a Young's modulus of 40 GPa or higher.

12. The glass substrate according to claim 1, having a porosity of 0.1% or less.

13. The glass substrate according to claim 1, having a transmittance at 350-nm wavelength of 50% or higher.

14. The glass substrate according to claim 1, having a thickness in the range of 0.05-1 mm and a substrate area in the range of 225-10,000 $cm^2$.

15. A circuit board for a high-frequency device in which high-frequency signals having a frequency of 10 GHz or more is processed, the circuit board comprising:
    the glass substrate according to claim 1; and
    a wiring layer formed on the main surface of the glass substrate,
        wherein the circuit board has a transmission loss at 35 GHz of 1 dB/cm or less.

* * * * *

UNITED STATES PATENT AND TRADEMARK OFFICE
CERTIFICATE OF CORRECTION

PATENT NO. : 12,037,283 B2
APPLICATION NO. : 17/174615
DATED : July 16, 2024
INVENTOR(S) : Kazutaka Ono et al.

Page 1 of 1

It is certified that error appears in the above-identified patent and that said Letters Patent is hereby corrected as shown below:

In the Claims

In Column 23, Line 24, delete "13 to 23% of $B_4O_3$;" and insert --13 to 23% of $B_2O_3$;--, therefor.

Signed and Sealed this
Twenty-first Day of January, 2025

Coke Morgan Stewart
*Acting Director of the United States Patent and Trademark Office*